United States Patent [19]
Rudigier et al.

[11] Patent Number: 5,464,683
[45] Date of Patent: Nov. 7, 1995

[54] COATED TRANSPARENT SUBSTRATE

[75] Inventors: Helmut Rudigier, Bad Ragaz, Switzerland; Reinhard Sperger, Feldkirch, Austria

[73] Assignee: Balzers Aktiengesellschaft, Balzers, Liechtenstein

[21] Appl. No.: 986,365

[22] Filed: Dec. 7, 1992

[30] Foreign Application Priority Data

Dec. 13, 1991 [CH] Switzerland .............. 3700/91

[51] Int. Cl.6 ........................................... B32B 9/04
[52] U.S. Cl. ............... 428/216; 428/432; 428/469; 428/472; 428/697; 428/698; 428/699; 428/701; 428/702
[58] Field of Search .................. 428/216, 469, 428/472, 701, 702, 698, 432, 697, 699

[56] References Cited

U.S. PATENT DOCUMENTS 3,885,855  5/1975  Gross ......................... 350/166
4,861,669  8/1989  Gillery et al. ............... 428/434
4,900,633  2/1990  Gillery et al. ............... 428/432
4,947,081  8/1990  Ohiwa et al. ................ 313/509
5,085,926  2/1992  Iida et al. .................... 428/216

FOREIGN PATENT DOCUMENTS 0303587   2/1989  European Pat. Off. .
4006029   8/1990  Germany .
57-161058 4/1982  Japan .
60-81048  3/1985  Japan .
3008137   5/1989  Japan .

OTHER PUBLICATIONS

Search Report–CH 3700/91.

Primary Examiner—Archene Turner
Attorney, Agent, or Firm—Notaro & Michalos

[57] ABSTRACT

A coated transparent substrate is composed of a multi-layer layer-system on at least one of its sides with at least one layer of the oxynitride of hafnium, the layer-system comprising a sequence of hafnium-oxynitride layer and silicon-oxide layer.

3 Claims, 10 Drawing Sheets

COATED TRANSPARENT SUBSTRATE

BACKGROUND OF THE INVENTION

1. FIELD OF THE INVENTION

The present invention is directed to a coated transparent substrate, which comprises, on at least one of its sides, a multi-layer layer-system. More specifically, the invention is directed to such a transparent substrate where the multi-layer layer-system is also transparent and the coated substrate is thus for instance a window substrate as e.g. for vehicle windows and especially for motor vehicle front windows.

The present invention is further directed on a method for producing at least one layer on a workpiece by means of a reactive deposition process, to a method for coating a workpiece with at least two layers of different materials, to an apparatus for producing at least one layer on a workpiece and finally to a Hafnium-Oxynitride.

2. DEFINITIONS

The following terms are used throughout the description and claims of the present invention:

Spectral range of visible light

Spectral range according to a light wave-length A of 380 nm to 780 nm.

Spectral range of sunlight

Spectral range according to a wave-length $\lambda$ of 200 nm to 2500 nm.

Spectral range of near (or low) infra-red light

Spectral range according to a wave-length A of 780 nm to 1200 nm.

Coefficient of reflectance $R_{vis}$

The ratio of reflected to impinging light, weighed by the spectral sensitivity of the human eye:

$$R_{vis} = \frac{\int_{380\,nm}^{780\,nm} R(\lambda)V(\lambda)S(\lambda)d\lambda}{\int_{380\,nm}^{780\,nm} V(\lambda)S(\lambda)d\lambda}$$

wherein:

$R(\lambda)$ is the value of reflection at a specific wavelength $\lambda$, $V(\lambda)$ is the spectral sensitivity of the human eye, $S(\lambda)$ is the spectral distribution of the standard light D65 (colour temperature 6500 K.).

Coefficient of transmittance $T_{vis}$:

The ratio of transmitted to impinging light weighed by the spectral light sensitivity of the human eye:

$$T_{vis} = \frac{\int_{380\,nm}^{780\,nm} T(\lambda)V(\lambda)S(\lambda)d\lambda}{\int_{380\,nm}^{780\,nm} V(\lambda)S(\lambda)d\lambda}$$

wherein $T(\lambda)$ is the transmittance value at a specific wavelength $\lambda$.

Coefficient of transmittance $T_{sun}$:

The ratio of transmitted and impinging light weighed with the spectral distribution of sun light.

$$T_{SUN} = \frac{\int_{200\,nm}^{2500\,nm} T(\lambda)S_s(\lambda)d\lambda}{\int_{200\,nm}^{2500\,nm} S_s(\lambda)d\lambda}$$

wherein $S_s(\lambda)$ is the spectral distribution of sun light.

Coefficient of reflectance $R_{SUN}$:

The ratio of reflected light and impinging light weighed with the spectral distribution of sun light.

$$R_{SUN} = \frac{\int_{200\,nm}^{2500\,nm} R(\lambda)S_s(\lambda)d\lambda}{\int_{200\,nm}^{2500\,nm} S_s(\lambda)d\lambda}$$

Absorption $A_{SUN}$:

$$A_{SUN} = \frac{\int_{200\,nm}^{2500\,nm} A(\lambda)S_s(\lambda)d\lambda}{\int_{200\,nm}^{2500\,nm} S_s(\lambda)d\lambda}$$

wherein $A(\lambda)$ is the value of absorption at a specific wavelength $\lambda$.

Extinction coefficient k:

When light with a wave-length $\lambda$ and with the intensity $I_o$ is transmitted through a material of the thickness d, there results, at the output side, the intensity $$I = I_o \cdot e^{-\alpha(\lambda) \cdot d}$$

wherein there is valid $$k(\lambda) = \alpha \frac{\lambda}{4\pi}$$

DESCRIPTION OF PRIOR ART

It has been proposed to realize heat protective layer-systems based on pure metal layers, so as for instance on silver layers, or based on metallic Nitride layers as for instance on TiN-layers. Such layers are embedded between two metal-oxide layers with preferably high index of refraction.

It is also known that silver layers are chemically not stable and are oxidized for instance during the application of the overlaying Oxide layer and thus lose their favourable optical qualities or tend to form so-called silver islands.

It is further often difficult to ascertain a satisfying adherence between the silver layer and the Oxide layers which poor adherence drastically influences negatively the wear and abrasion resistance of such layer systems.

From the DE-A-33 07 661 it is known to apply onto a silver layer a thin metallic layer so as to reduce the said tendency to form silver islands.

From the DE-A-33 29 504 it is further known to improve resistance and life-time of such layer systems by providing a steady transition interphase between the oxidic layer ($TiO_2$) and the silver layer. Nevertheless, it must be pointed out that a satisfying improvement of the wear and abrasion resistance may probably not be reached and that the characteristics of reflectance and transmittance will be relatively narrow-banded and that further the transmittance will be relatively poor for light in the spectral range of visible light.

Problems of three layer-systems formed of Titanium, TiN, and Titanium-Oxide, especially as concerns high reflectance, adherence and wear resistance including abrasion resistance is discussed in Silikat-Technik 38 (1987), Vol. 8, p. 281–283. In Silikat-Technik 39 (1988), Vol. 9, p. 296–300, The disadvantages of Titanium-Nitride and silver layers, embedded in Titanium-Dioxyde layers, are discussed.

In the EP-A-0 334 991 a $SnO_2$/SnNi/$SnO_2$ -layer system is proposed with a suboxidic SnNi-layer as a heat protective layer-system. Thereby relatively high heat transmittance values are reached, a good transmittance of above 60% for visible light, which latter, nevertheless, is only reached by a tempering process.

Further, attention is drawn to the EP-A-0 303 587 with respect to layer-systems based on silver layers.

With respect to dielectric layer-systems, attention is drawn to the U.S. Pat. No. 4,461,532.

With respect to further transparent coated substrates attention is also drawn to the DE-A-40 24 308 and the EP-A-0 402 075.

From Patent Abstracts of Japan, Vol. 9, No. 218 (C-301)(1941), Sep. 5, 1985, & JP,A,60081048 TOYOTA JIDOSHA KK), May 9, 1985, it is known to deposit by a reactive sputtering process in an oxygene atmosphere a Titanium-Oxide layer on a glass substrate. After interruption of Oxygen inlet and starting of the Nitrogen inlet, a Titanium-Nitride layer is deposited. Thereby a coated transparent substrate is realized with a multi-layer layer-system for decorative purposes, whereby the layer-system is not transparent. The layer-system consists essentially of Titanium-Oxide and Titanium-Nitride layers.

It is further known from the U.S. Pat. No. 4,947,081 to realize a Tantalum-Oxynitride layer as a diffusion barrier for Oxygen at an electro-luminescence element.

It is further known from Patent Abstracts of Japan, Vol. 15, No. 119 (P-1183)(4647), Apr. 22, 1991, & JP,A,3008137 (NEC CORPORATION), Jan. 16, 1991, to provide a corrosion protective layer made of an Oxynitride of one of the elements Si, Ti, Zr, Hf, Al or Ta at an optical storage element.

It is further known from the DE-A-40 06 029, which corresponds with the U.S. Pat. No. 5,085,926, to provide a coated transparent glass substrate, whereon a six-layer system is provided. Such a substrate is used as window glass for motor vehicles. Departing from the glass substrate, the said six-layer-system comprises a second and a fourth layer made from a Nitride or an Oxynitride of a metal, which is selected from the group Ti, Zr, Ta, Cr, a Ni/Cr-alloy or stainless steel. These second and fourth layers are deposited with a thickness of between 3 and 20 nm and are selected preferably even thinner. They are provided to improve the adherence between the first and third, third and fifth layers respectively. The sixth layer which is thicker than 30 nm and is provided as a wear protective layer and is formed from the Oxide or Oxynitride of an alloy which is selected from Si/Al-, Si/Ti- and Si/Ni-alloys or from the Nitride or Oxynitride of aluminium. Preferably the thickness of this sixth layer as a wear protective layer is selected between 40 and 200 nm.

SUMMARY OF THE INVENTION

It is an object of the present invention to realize a coated transparent substrate, which has a reduced sun energy transmittance $T_{SUN}$, which acts anti-reflective in the visual spectral range and thus has low $R_{vis}$-values and is wear (including abrasion) resistant.

This is realized by a coated transparent substrate, which comprises on at least one of its sides a multilayer transparent layer-system with at least one layer of the Oxynitride of one of Hafnium, Zirconium, Tantalum and Titanium, so as to form a transparent optical element.

Thereby it has inventively been found that the said Oxynitrides of Hafnium, Zirconium, Tantalum and Titanium and especially the Oxynitride of Hafnium, have an especially high index of refraction in the visible and near infra-red spectral ranges and simultaneously features in the visible and in the near infra-red spectral range very low k-values. This allows to realize layer-systems with optimally few layers, which resolve the said object at low costs and, nevertheless, optically optimal, because especially HfON, TaON and ZrON are especially wear resistant.

It is a further object of the invention to further improve wear resistance of the inventive coated substrate which is realized by the Oxynitride-layer having a thickness of at least 30 nm, for further improvement of at least 50 nm, even of at least 70 nm and for utmost improvement of at least 90 nm.

It is a further object of the invention to resolve the object mentioned above on both sides of the transparent substrate, which is realized by the said transparent substrate comprising on both of its sides a multi-layer transparent layer-system with at least one layer of the Oxynitride of one of Hafnium, Zirconium, Tantalum and Titanium.

On one side of the substrate, a layer-system is applied which acts as heat protective system and as an anti-reflex system on the light-impinging side of the coated substrate. The layer-system applied on the other side of the substrate improves heat protection of the first mentioned system and aces as anti-reflex system as well.

When the said layer-system is applied on both sides of the substrate, the heat protective effect of the overall system is significantly improved above the heat protective effect of a single layer-system due to the good material characteristics of the Oxynitride of Hafnium, Zirconium, Tantalum or Titanium, and especially of the Oxynitride of Hafnium.

By realizing the said layer-system or the said two layer-systems as dielectric systems, i.e. with layers of the said Oxynitride embedded in layers of a dielectric material with lower refractive index, preferably made of $SiO_2$, a significant improvement of the reflectance characteristics in the near infra-red spectral range is reached, thus a significant and excellent heat protection. The good reflectance characteristic in the visible spectral range leads to the excellent anti-reflex characteristic. This due to the steep slope or edge of the reflectance course of the Oxynitride in the transition region from the visible light spectral range to the near infra-red spectral range at the overall system. When Hafnium-Oxynitride is applied, this is especially significant.

It is a further object of the present invention to realize said transparent substrates so that reflectance is improved in the spectral range of higher infra-red, which is above 1200 nm, additionally to the improved reflectance in the near or lower infra-red range, i.e. between 780 nm and 1200 nm. This is realized by providing the transparent substrate with a further multi-layer layer-system with at least one layer of a Nitride of one of Hafnium, Zirconium, Tantalum and Titanium and/or of Indium-Tin-Oxide.

By providing on one side of the transparent substrate a dielectric layer-system, i.e. without Nitride or Indium-Tin-Oxide-layer (ITO), but with a layer-system with at least one layer of the Oxynitride of one of Hafnium, Zirconium, Tantalum and Titanium, and on the other side of the transparent substrate, a multi-layer system with at least one layer of a Nitride of one of Hafnium, Zirconium, Tantalum and Titanium and/or of Indium-Tin-Oxide, the layer-system with the Nitride or ITO-layer provides for improved reflectance in the higher infra-red spectral range, i.e. above 1200 nm, additionally to the good reflectance in the low infra-red region between 780 nm and 1200 nm, which latter is predominantly caused to the system with the Oxynitride layer.

Again, the Oxynitride layer which is preferably provided on both layer-systems, and which preferably is made of Hafnium-Oxynitride, ascertains a high reflectance of heat radiation and a low reflectance in the visible spectral range due to the resulting steep reflectance edge in the reflectance curve in the transition area between the spectral areas of visible light and of near infra-red.

The Oxynitride layer and preferably the layer of Hafnium-Oxynitride forms the basis for the good heat protection and anti-reflex characteristics and forms further the basis that these good characteristics may be reached by as few as possible layers.

It is a further object of the present invention to improve the transparent substrate as concerns commercial production. This is realized by the transparent substrate with Nitride and Oxynitride-layers whereon the Nitride is a Nitride of the same metal from which the Oxynitride is formed. Thereby, preferably, the layer made of the Nitride and the layer made of the Oxynitride are provided one above the other.

Thereby, the basis is given to improve commercially optimal fabrication of such inventive transparent substrates by a method for coating a workpiece with at least two layers of different materials, which different materials comprise the same solid state component by a reactive coating process, which method comprises the steps of evaporating during deposition of both layers the same solid state material and changing from deposition of one layer to deposition of the other layer without interrupting deposition merely by changing the reactive gas applied to react with the solid state material.

This may even be realized if between the Nitride and Oxynitride-layers there is applied another layer as a layer of a lower refractive index material, so for instance of $SiO_2$, in that the layer deposition is first realized departing from a Hafnium as solid state material, then from Silicon and back again from Hafnium. Thereby the inlet reactive gas is accordingly changed. Thus, and without interrupting the deposition process, deposition of the desired layer sequence is realized in a commercially optimal way.

It is a further object of the present invention to improve wear resistance of the transparent substrate with the layer-system, above wear resistance of the substrate itself. This is realized by providing the coated transparent substrate, with the layer of the Oxynitride forming the second-outer layer of the layer system, considered in the direction towards the substrate.

In other words, the said Oxynitride and especially the said Oxynitride of Hafnium features, additionally to the unexpected exquisite optical characteristics, a wear resistance, which is, compared with the wear resistance of other optical coatings, so as compared with that of Nitride-layers, at least as good and which results in a wear resistance which is above that of common substrate materials as for instance above the wear resistance of glass.

It is a further object of the present invention to improve transmittance of the transparent substrate and especially the transmittance of the coated transparent substrate, which has on one of its sides a multi-layer transparent layer-system with at least one layer of the Oxynitride of one of Hafnium. Zirconium, Tantalum and Titanium, so as to form a transparent optical element, and which comprises on the other of its sides a multi-layer layer-system with at least one layer of a Nitride of one of Hafnium, Zirconium, Tantalum and Titanium and/or of Indium-Tin-Oxide. This is realized by said coated substrate featuring a transmittance at least for a substantial part of the visible light spectrum range of at least 70%. A still further improvement is reached by having said transmittance to be at least 75%.

It is a further object of the invention to further improve anti-reflex characteristic of the coated transparent substrate, which is realized by said coated substrate featuring reflectance of light for a substantial part of the visible light spectrum and up to a light-impinging angle of at least 60° which is reduced with respect to such reflectance of the uncoated substrate. Thereby an even further improvement is reached by said coated substrate having such a reduction of reflectance up to impinging angles of 65°. Thereby this object is further realized by the said substrate having a reflectance of at most 18%, at least for light in the spectral range according to light wave-lengths of between 520 nm and 620 nm (both limits included) and considered at least on one side of the coated substrate. Thereby the further improved coated transparent substrate shows the said latter mentioned reflectance up to light impinging angles of at least 60°, and even of at least 65°.

A further improved anti-reflex characteristic of the coated transparent substrate features a further reduction of reflectance down to 15% at the most within the said spectral range according to light wavelengths between 520 nm and 620 nm, and considered at least on one side of the coated substrate. As it is a further object of the present invention to improve transmittance of the coated transparent substrate, this is realized by the coated transparent substrate with a transmittance of light at least in the spectral range according to light wave-lengths of 450 nm to 600 nm, both limit values included, being at least 70% and, for a further improvement, being at least 75%.

At an improved coated transparent substrate the index of refraction of the said Oxynitride is 2.5 to 3 (both limit values included) for light with a wavelength of 400 nm. Thereby a further improved substrate features the said index of refraction to be between 2.6 and 2.8 (both limit values included).

Additionally to the said improved index of refraction of the inventively applied at least one Oxynitride-layer, the said Oxynitride has an extinction coefficient k of at most 0.02 and even, as a further improvement, of at the most 0.01.

A preferred embodiment of the inventive coated transparent substrate has a layer-system which is construed, considered in direction from the substrate, with a layer of Oxynitride of one of Hafnium, Zirconium, Tantalum and Titanium, a Nitride-layer, an Oxynitride-layer and additional layers, whereby, in a further preferred embodiment, the Nitride-layer is made of Nitride of the same metal as the Oxynitride-layer of one of Hafnium, Zirconium, Tantalum and Titanium. The additional layers mentioned above are additionally formed in a preferred embodiment of the inventive substrate by a further of the inventive multi-layer layer-system.

A further today preferred embodiment of the inventive coated transparent substrate has a layer-system which is construed, considered in direction from the substrate, of an Indium-Tin-Oxide-layer, a layer with low index of refraction, an Indium-Tin-Oxide-layer and further layers, whereby, in a further preferred embodiment, the layer with low index of refraction is made of Silicon-Oxide. Thereby the said further layers are construed in a further preferred embodiment as the said inventive layer-system, i.e. comprising an Oxynitride-layer of one of Hafnium, Zirconium, Tantalum and Titanium.

As has already been mentioned, the preferred embodiment of the inventive coated transparent substrate comprises said Oxynitride being Oxynitride of Hafnium.

Thereby, the said Hafnium-Oxynitride preferably applied and written in the form $HfO_xN_y$ has preferably a ratio x/y according to $3/2 \leq x/y \leq 3$, and even of $3/2 \leq x/y \leq 2$, and in an even further preferred embodiment said ratio x/y is 1.7 at least approximately.

The said Hafnium-Oxynitride which forms preferably the material of the said one Oxynitride-layer, has, at a preferred embodiment of the coated transparent substrate, an index of refraction within the range of 2.5 to 2.8 (both limit values included) for light with a wave-length of 400 nm. Thereby preferably and additionally, the extinction coefficient k of said Hafnium-Oxynitride is at the most 0.02 and even at the most 0.01.

An improved coated transparent substrate according to the invention has at least the Oxynitride-layer produced by a reactive deposition process and thereby preferably by a reactive ion-plating process or a reactive sputter deposition process. Due to the realized excellent heat protective characteristic with simultaneously optimized anti-reflex characteristic and wear resistance, the inventive coated substrate, in a preferred embodiment, is realized as a transparent window substrate, and especially forms a motor vehicle window, thereby even a motor vehicle front window which is especially subject to wear and requires highest demands with respect to anti-reflex effects.

It is a further object of the present invention to provide a method for producing at least one layer on a workpiece by means of a reactive deposition process, at which a mixture of at least two gases is introduced as a reactive gas to a reaction chamber, of which the mixture ratio, when inlet into the said reaction chamber, is closely controlled as concerns especially the time constancy of the said mixture ratio. This is realized by a method for producing at least one layer on a workpiece by means of a reactive deposition process, which deposition process comprises the steps of introducing at least two gases separately with a predetermined ratio of weight to a container, maintaining the gases introduced within said container for a predetermined time-span depending from the species of the gases, and introducing the mixture of the two gases at the predetermined ratio to a reaction chamber for the reactive deposition only after the lapse of said time-span, and then reacting the gases in the chamber to produce the reaction product and depositing on the workpiece a layer of the reaction product.

Especially during development of the inventive coated transparent substrate, it has been recognized that during deposition of layers by a reactive deposition process, be it a chemical wafer deposition or a plasma enhanced chemical wafer deposition or a reactive sputtering deposition process, the mentioned method leads to utmost constancy of the gas mixture ratio over time when introduced to the respective reaction chamber. It thereby was recognized that known approaches, namely to provide the at least two gases in separate containers and admixing the gases from separate containers only when inlet to the reaction chamber by respective dosing the quantity of gas respectively outlet from the containers by means of adjusting valves, may not be used for critical layer deposition.

By the said inventive method the gas mixture inlet to the reaction chamber has a mixture ratio which is constant over time and which is exactly predictable, which is due to the fact that the components of the gas mixture are admixed a predetermined time-span before the mixture being applied to the coating process in the predetermined ratio. The time-span depends from the species of gases which form the mixture. By providing such time-span a homogeneous mixture ratio is realized in the container and over its volume. The more the gas mixture components are similar with respect to their molecular weights, the more the said time-span becomes important.

In a today preferred mode of realization of such method for producing Hafnium-Oxynitride-layers it is performed with an ion-plating apparatus. Such apparatus is for instance an apparatus of the type BAP 800 of Balzers AG, as it is for instance described in Proceedings Reprint, SPIE—The International Society for Optical Engineering, reprinted from Optical Thin Films III: New Developments, Jul. 9–11, 1990, San Diego/Calif., Vol. 1323, 19, 20, or in special reprint from the paper Metalloberflä che, Zeitschrift für Oberflächenbearbeitung metallischer und nicht metallischer Werkstoffe, (Metal Surface, Journal for Surface Treatment of metallic and non-metallic material), 42nd issue, 1988/10, Karl Hanser, Mü nchen, R. Buhl and H. K. Pulker, Balzers/Liechtenstein, "Reaktives Ion-Plating zur Herstellung yon Nitrid- und OxidSchichten", ("Reactive ion-plating for manufacturing Nitride- and Oxide-layers"), which references shall be introduced by reference as part of the present disclosure with respect to ion-plating apparatus. Thus the said method is performed by reactive depositing Hafnium-Oxynitride as the reaction product by means of ion-plating in the reaction chamber and thereby maintaining within the chamber an Argon gas pressure of $3 \cdot 10^{-4}$ mbar, a partial pressure of Oxygen/Nitrogen mixture of $5 \cdot 10^{-4}$ mbar and thereby setting the Oxygen/Nitrogen mixture to 22% per weight Oxygen and 78% per weight Nitrogen. It is a further object of the present invention to provide a Hafnium-Oxynitride with improved optical characteristics. This is realized by the Hafnium-Oxynitride with an index of refraction between 2.6 and 2.8 (both limit values included) and additionally with an extinction coefficient k of 0.02 at the most for light substantially in the entire range of wavelengths between 400 nm and 1000 nm (both limit values included).

The further improved Hafnium-Oxynitride has an extinction coefficient k of 0.01 at the most. Thereby this improved Oxynitride is preferably processed by introducing at least two gases separately with a predetermined ratio of weight to a container, maintaining the gases introduced within said container for a predetermined time-span and introducing the mixture of said two gases at said predetermined ratio to the reaction cheer for reactive deposition after lapse of said time-span and then reacting said gases in said cheer with Hafnium to produce said Hafnium-Oxynitride. Thereby the improved Hafnium-Oxynitride, written in the form $HfO_xN_y$ has a ratio x/y of 1.5 $x/y \leq 3$, and even preferably of $1.5 \leq x/y \leq 2$ and even of $1.6 \leq x/y \leq 1.8$, and has most preferably the said ratio being 1.7 at least approximately. The primary object on which the present invention is based is thus primarily resolved by the at least one layer of Oxynitride of Hafnium, Zirconium, Tantalum or Titanium. The best results were achieved with the Hafnium-Oxynitride-layer, the second best results with Zirconium-Oxynitride- or Tantalum-Oxynitride-layers, and the third best results by Titanium-Oxynitride-layers, which latter especially did not fulfill the highest requirements as concerns wear resistance. The Hafnium-Oxynitride which showed the best optical and simultaneously the best mechanical characteristics for the multi-layer system has for instance the following characteristics:

- at light of a wave-length of 400 nm, an index of refraction of 2.7 and simultaneously an extinction coefficient k of 0.01 at the most;
- at light of 800 nm wave-length, an index of refraction of 2.55 and simultaneously an extinction coefficient k of 0.005 at the most and
- at light of 1000 nm wave-length, an index of refraction of 2.53 and simultaneously an extinction coefficient k of 0.001 at most.

From these values found optimal up to the present time, certain deviations may clearly be accepted in that for instance, for light of a wave-length of 400 nm, values of the index of refraction of 2.5 to 3 and preferably of 2.6 to 2.8 are acceptable and with respect to the extinction coefficient k of at most 0.02 and preferably of 0.01 for the inventive coated transparent substrate.

The inventively applied Oxynitride-layer and especially the excellent Hafnium-Oxynitride are produced by a reactive evaporation coating process, be it by evaporation of the respective metal by means of heated crucibles, be it by electron beam evaporation or be it by reactive sputtering of the respective metals from a target material.

BRIEF DESCRIPTION OF THE DRAWINGS

The present invention will be better understood and objects other than those set forth above will become apparent when consideration is given to the following detailed description thereof. Such description makes reference to the annexed drawings, wherein.

DESCRIPTION OF PREFERRED EMBODIMENTS AND OF THE BEST MODE OF THE INVENTION

Figure 1:
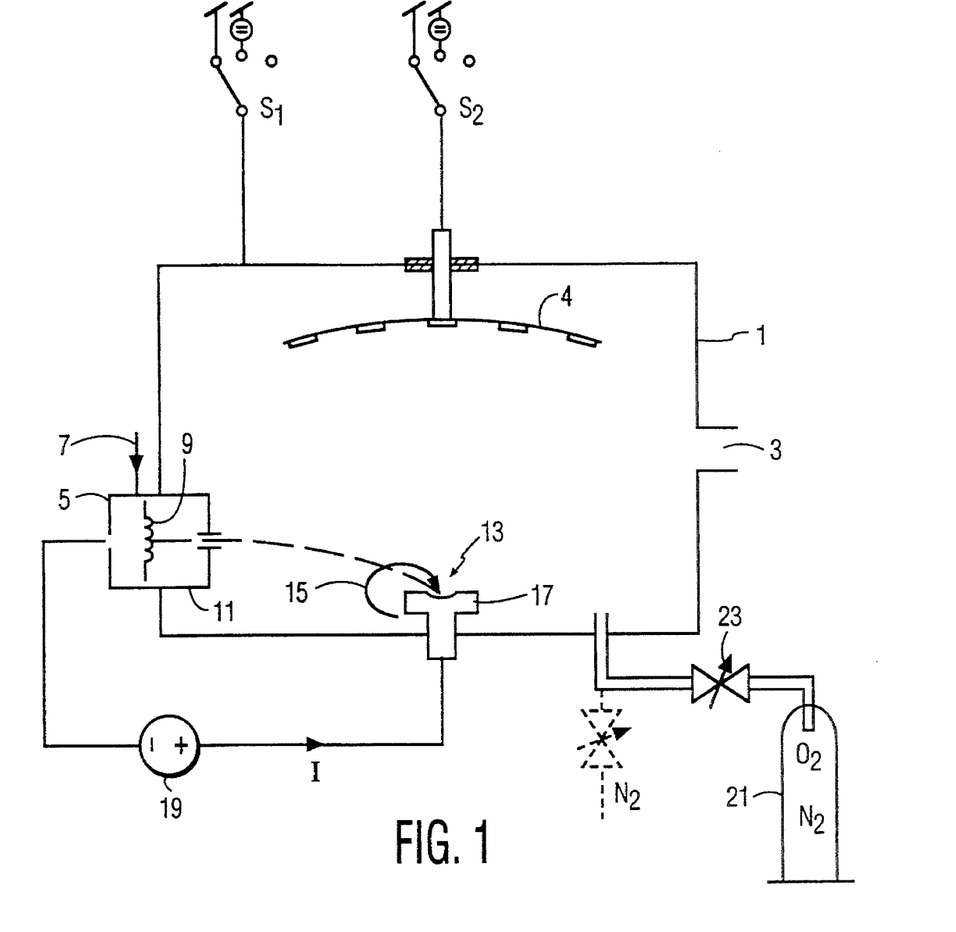
FIG. 1 schematically shows an ion-plating apparatus as an example of an inventively used reactive layer deposition apparatus with a reactive gas inlet arrangement according to one aspect of the present invention.

The apparatus preferred up to today to realize the inventive coated transparent substrate is schematically shown in FIG. 1. It is an ion-plating apparatus BAP 800 of Balzers AG/Liechtenstein. The inventively applied Oxynitride, nevertheless, may be produced and deposited by a different apparatus, generally by means of an apparatus performing a reactive evaporation process CVD (chemical vapor deposition) or a PECVD (plasma enhanced chemical vapor deposition) or which performs reactive sputtering, be it with DC or AC plasma, with or without electrical biasing the coated substrate, or by thermical crucible evaporation.

Today, in a preferred embodiment, preferably the metallic component, i.e. Hafnium, Zirconium, Tantalum or Titanium, are evaporated and are reacted with an $O_2/N_2$ gas mixture. Thereby it would also be possible to evaporate as the solid state material a sub-oxide or sub-nitride of the said metal.

The apparatus according to FIG. 1, as was said according to the Balzers BAP 800, comprises a vacuum recipient 1 with a pump connection 3, a substrate carrier 4 in the form of a rotating carrier calotte. The substrate carrier 4 is mounted within the vacuum recipient 1 in electrically isolated manner. An electron source 5 with gas inlet 7, e.g. for Argon, comprises a thermical electron emitter, e.g. in the form of a heated filament 9, in an electron chamber 11. In the electron chamber 11 means are provided as is known to the man skilled in the art for focusing and accelerating an electron beam, which are not shown.

The apparatus further comprises an electron beam evaporator arrangement 13 which is, with respect to chamber 1, electrically isolated. This electron beam evaporator arrangement 13 comprises an electron beam generator, generating an electron beam 15 which is deflected by approximately 270° and impinges on the schematically shown crucible 17.

The electron emitter 9 is set on cathodic potential with respect to crucible 17 by means of an electric source 19. Thereby the electrons emitted from the electron source 5 are accelerated towards crucible 17.

The wall of the vacuum chamber 1 as well as the substrate carrier calotte 4 are, as schematically shown by $S_1$ and $S_2$, respectively set on ground potential or on a reference potential or are set on floating potential.

The inventively applied Oxynitride layers were up to now produced with the schematically shown apparatus, thereby predominantly from Hafnium-Oxynitride. The substrates and accordingly the carrier calotte 4 was set on floating potential and the wall of chamber 1 was set on ground potential. From the crucible 17 the metal was electron beam evaporated. The following process parameters were set:

partial pressure of Argon: $3 \cdot 10^{-4}$ mbar;

partial pressure of the $O_2/N_2$-gas mixture: $5 \cdot 10^{-4}$ mbar;

$O_2/N_2$-mixture: 22% per weight $O_2$, 78% per weight $N_2$;

discharge current I: 60A;

deposition rate: 0.3 nm per second.

For all the mentioned reactive vapor deposition processes for producing the inventively provided Oxynitride it is of predominant importance how the reactive gas mixture is fed to the respective process chamber. As is shown in FIG. 1, a gas container 21 is connected to vacuum chamber 1 by means of an adjusting valve 23, whereby the container 21 is prefiled with a reactive gas mixture of the desired mixture ratio well before the reactive layer deposition process is started.

Thus, in container 21 the gas mixture components are separately filled in long before initiating the layer deposition process, so that in dependency of the introduced gas species into container 21 a homogeneous distribution of mixing ratio is achieved throughout container 21. Specifically for producing the Oxynitride-layer it has been found that this homogenization of the gas mixture in container 21 is achieved after a time-lag of at least 24 hours, preferably after a longer time, to the desired extent.

By such procedure, a Hafnium-Oxynitride-layer was deposited onto clear transparent glass or to coloured glass, whereby the resulting Hafnium-Oxynitride-layer was characterized by the following excellent values:

|  | Index of refraction | Extinction coefficient k |
| --- | --- | --- |
| 400 nm | 2,7 | k < = 0,01 |
| 800 nm | 2,55 | < = 0,005 |
| 1000 nm | 2,53 | < = 0,001 |

Similar to the values of the Hafnium-Oxynitride-layer, but rather somewhat less good are the optical characteristic values index of refraction and extinction coefficient k of resulting Zirconium-Oxynitride, Tantalum-Oxynitride and Titanium-Oxynitride.

The index of refraction of those materials was in the range of between 2.5 and 3 and the extinction coefficient k was at the most 0.02 within the above mentioned range of light wave-lengths. For the Hafnium-Oxynitride-layer produced as mentioned above and written in the form $HfO_xN_y$, x/y-values were found by the RBS-method (Rotherford Backscattering technique):

$1.5 \leq x/y \leq 3$, whereby the said excellent characteristics were found especially when x/y ranged according to $1.5 \leq x/y \leq 2$, and thereby especially to $1.6 \leq x/y \leq 1.7$. Within this latter range best results were found for the Hafnium-Oxynitride-layer with x/y being 1.7 at least approximately.

Thereby the other mentioned x/y-ranges resulted in similarly good optical characteristics, so that the mentioned ranges define for a Hafnium-Oxynitride with inventively improved and novel characteristics.

In the following, the inventive coated transparent substrate shall be described with at least one layer of the just described inventive Oxynitride as basis component, which coated substrate resolves the primary object of the present invention. Thereby, the Oxynitride-layers according to the following description are produced following one of the just described methods, whereat the reactive gas mixture has been premixed in a container well in advance of starting the respective layer deposition.

According to FIG. 2, the uncoated substrate 20 preferably made of glass, be it of green glass, clear glass or another coloured glass, comprises on one of its sides 20A preferably a layer-system 23 still to be described and on its second side 20B the second multi-layer layer-system 24, which now will be described.

Whether only on one side of the substrate a layer-system is provided or on both of its sides, in every case the one or each of the layer-systems comprises at least one layer of the mentioned inventive Oxynitride and preferably an Oxynitride-layer of the said novel Hafnium-Oxynitride. Because it was recognized that especially Hafnium-Oxynitride, Zirconium-Oxynitride and Tantalum-Oxynitride feature an excellent wear resistance, preferably the one or both of the provided layer-systems, comprises at least as the second outer layer such a wear resistant Oxynitride-layer.

As will be described, both layer-systems 23 and 24 may be construed equally. In a minimal configuration the system 24 is made of a layer of high refractive index material 25 and of a layer of low refractive index material 27. In this minimal configuration the layer of high refractive index material is formed from one of the inventive Oxynitrides mentioned, and the layer of low refractive index material 27 is preferably made of Silicon-Oxide.

Figure 2:
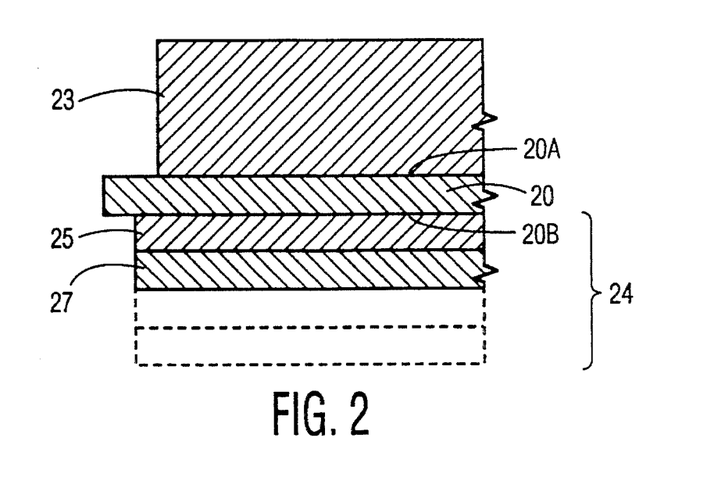
FIG. 2–6 several configurations of an inventively coated transparent substrate with multilayer system resulting in a transparent optical element.

As shown in FIG. 2 in dashed lines, the system 24 may, departing from its minimal configuration, comprise a further sequence of layers of high and low refractive index materials. Thereby, and as was mentioned, at least the second outermost layer consists of the inventive Oxynitride and preferably of the said Hafnium-Oxynitride. Again, as a low index of refraction layer material, preferably Silicon-Oxide is applied.

In a preferred embodiment all layers of high refractive index material are made of the inventive Oxynitride at the system 24 which is provided on one or on both sides of the substrate 20. The application of the layers of low refractive index material, preferably of Silicon-Oxide, is preferably also performed by means of a reactive vapor deposition process, be it by reactive ion-plating, reactive electron beam evaporation, reactive crucible evaporation with heated crucible or by reactive sputtering. The optical characteristic values, especially index of refraction and extinction coefficient of the high refractive index layer materials made from the inventive Oxynitrides, are within the above mentioned range, index of refraction between 2.5 and 3, extinction coefficient $k \leq 0.02$ for light with wave-lengths between 300 nm and 1000 nm.

Due to the excellent optical characteristics of the inventive Oxynitride layers, especially those of the inventive Hafnium-Oxynitride, there results in the visible light spectral range an extremely good anti-reflex characteristic up to high impinging angles for the light, simultaneously a high reflectance and further, simultaneously, a low absorption for light in the near infra-red range. In other words, there is realized a steep slope or edge of the reflectance curve in the interesting spectral range of light between that of visible light and that of near infrared. Thereby sunlight has high energy especially in the last mentioned near infra-red range. The steep slope which is realized just optimally in the transition area between visible light and near or low infra-red, thus occurs at approximately 800 nm wavelength. Thereby a broad-band anti-reflex effect is realized in the spectral range of visible light with a minimum number of layers and simultaneously an optimal heat protective effect.

The said broad-band characteristic of low reflectance in the spectral range of visible light further reduces colour sensitivity of the anti-reflex characteristic of the one or of the two inventively provided layer-systems.

By appropriate design of layer-systems applied on both sides of the substrate, as will be described below, the optical characteristics of the overall system may be drastically improved above such characteristics of the layer-system 24 considered separately.

Figure 3:
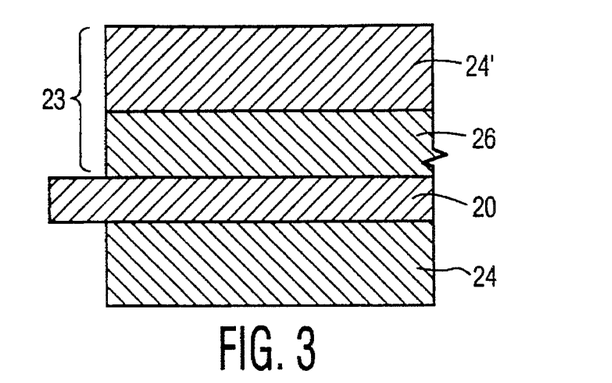

A substrate 20, according to FIG. 3, is provided on both sides with a layer-system, namely on one of its sides with the system 24, as has been described in connection with FIG. 2, and on the other side with a layer-system 23. For a substrate forming a window, and especially a motor vehicle window, thereby especially a motor vehicle front window, which demands the highest requirements as concerns optical characteristics and mechanical characteristics, the layer-system 23 is disposed inwards, i.e. to be applied towards the inside, for instance of a car. The layer-system 23 comprises a sub-system 26 which is tailored as a heat protective system and which comprises, according to FIG. 4, a first layer 28 of an inventive Oxynitride, preferably of Hafnium-Oxynitride. Above this layer 28, a thinner metallic Nitride-layer 30 of Hafnium, Zirconium, Tantalum or Titanium is provided, preferably again a Hafnium-Nitride-layer.

Figure 4:
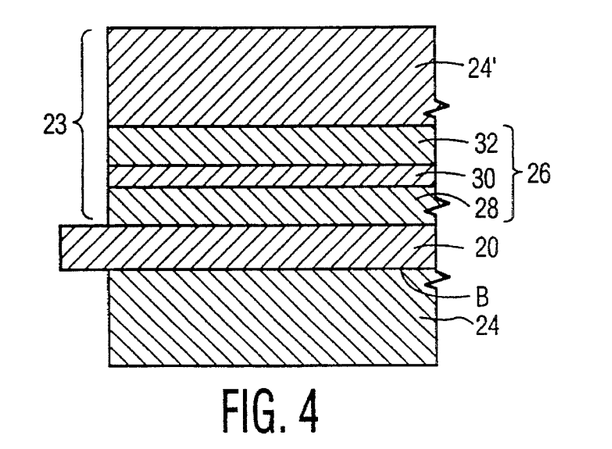

Above the metallic Nitride-layer, there is provided an Oxynitride-layer 32, which is followed from the "minimal configuration" layer-system 24 as it was described in connection with FIG. 2.

In a preferred embodiment the Oxynitride- and Nitride-layers, which are disposed one above the other, comprise the same metal component, i.e. preferably Hafnium or a Sub-Nitride of Hafnium. Looking back to the explanations which were given in connection with the inventive method of production with respect to the apparatus shown in FIG. 1, this leads to the most simple production cycles of Oxynitride- and Nitride-layer sequence by the fact that without interrupting the deposition process, there may be deposited on an already deposited Oxynitride- or Nitride-layer respectively, a Nitride- or Oxynitride-layer just by changing at least the reaction gas inlet into the chamber 1 and used for the deposition process or at least its mixture ratio. Thus in the here discussed case the reactive gas is changed from $N_2$ to an $O_2/N_2$-mixture and vice-versa. It is obvious for the man skilled in the art that eventually the other process parameters are appropriately adjusted.

There results, thus, a principally inventive method of producing subsequent layers of different materials, which materials base on the same solid state components, in that the layer deposition process is not interrupted, but during evaporation of one and the same solid state material the layer sequence is controlled just by changing the reaction gas or the reaction gas mixture.

In FIG. 4 the layer-system 24, according to FIG. 2, is acting as a sub-layer-system 24' of layer-system 23.

The layer-system 23, according to the FIGS. 3 or 4, is to be said a "metallic/dielectric" system because of the at least one Nitride-layer provided. The layer-system 24 which exclusively consists of Oxynitride-layers and of layers of low refractive index materials, preferably of $SiO_2$, is a "dielectric" system.

Figure 5:
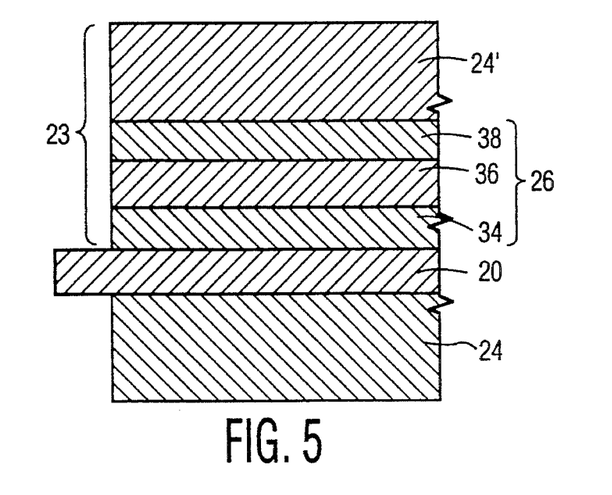

In FIG. 5 a further embodiment of sub-system 26 of the layer-system 23, which predominantly acts as heat protective system, is shown. It comprises on the substrate 20 a first layer 34 of Indium-Tin-Oxide (ITO) followed by a layer 36 of a low index of refraction material, as was mentioned, preferably of Silicon-Oxide. This latter layer is followed by a layer 38 made from the said Indium-Tin-Oxide. This latter Indium-Tin-Oxide-layer is followed, as a sub-system, by the layer-system 24 of FIG. 2 at least in its "minimal configuration".

With the layer-systems 23 and 24 according to FIG. 5, especially green glasses are coated as substrate material without significant reduction of their transmittance characteristic in the spectral range of visible light.

Figure 6:
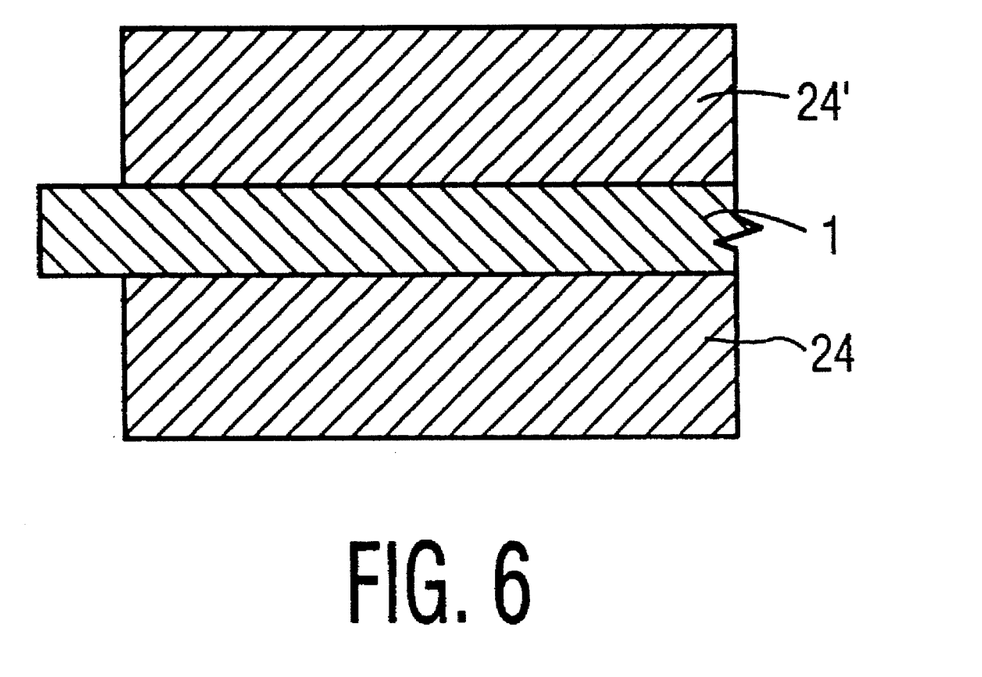

FIG. 6 shows a further embodiment of the inventive coated substrate, which has on both of its sides a dielectric layer-system according to 24, 24'.

EXAMPLE 1

According to FIG. 7A and as an outside window on a clear glass substrate 20, a dielectric/metallic layer-system 23, as was principally explained in connection with FIG. 4, was applied. This on that side of the substrate 20 which was intended to point towards the inside of, generally spoken, a room. On the outer side of the substrate 20 there was applied the dielectric layer-system 24. The dielectric/metallic layer-system 23 is construed according to table 1.1. departing from the substrate:

TABLE 1.1

|  | HfON | HfN | HfON | $SiO_2$ | HfON | $SiO_2$ |  |
|---|---|---|---|---|---|---|---|
|  | 38 | 14 | 43 | 182 | 95 | 81 | [nm] |
| optical thickness | .2H | — | .22H | .54L | .49H | .24L |  | design wave-length $\lambda_d$: 500 nm

Thereby the indications with respect to "optical thickness" are noted according to the following convention:

'H' denotes a layer with the optical thickness of one design wave-length $\lambda_d$ of a high (H) refractive index material. The optical thickness results from the product of index of refraction for light of the design wave-length and the physical (measured) thickness.

In analogy 'L' denotes a layer with the optical thickness of one design wave-length of a material of low refractive index.

The dielectric layer-system 24, on the other hand, is construed according to table 1.2, again departing from the substrate:

TABLE 1.2

|  | HfON | $SiO_2$ | HfON | $SiO_2$ | HfON | $SiO_2$ |  |
|---|---|---|---|---|---|---|---|
|  | 8 | 42 | 103 | 193 | 98 | 95 | [nm] |
| optical thickness | .04H | .125L | .53H | .57L | .505H | .28L |  | design wave-length $\lambda_d$: 500 nm

Figure 8A:
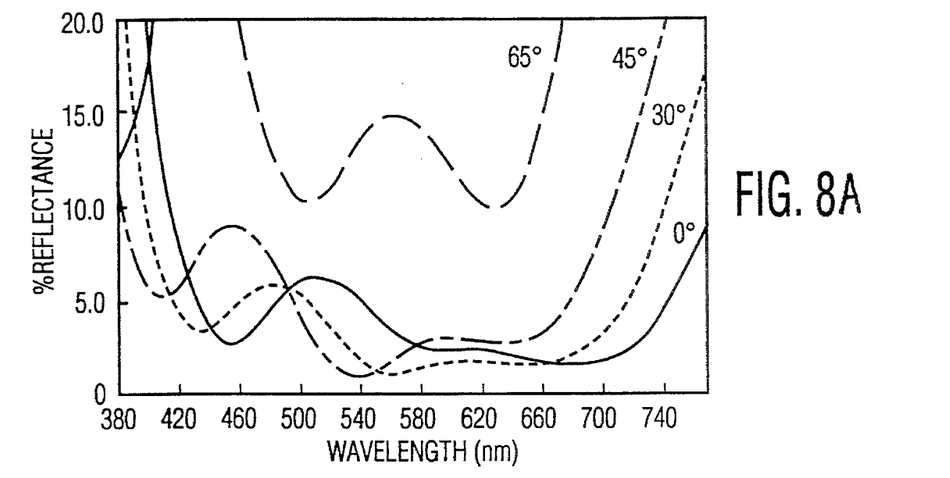

The reflectance characteristic for light in the visible spectral range of this inventive system is shown in FIG. 8A for impinging angles of the light of 65°, 45°, 30° and 0°.

Figure 9A:
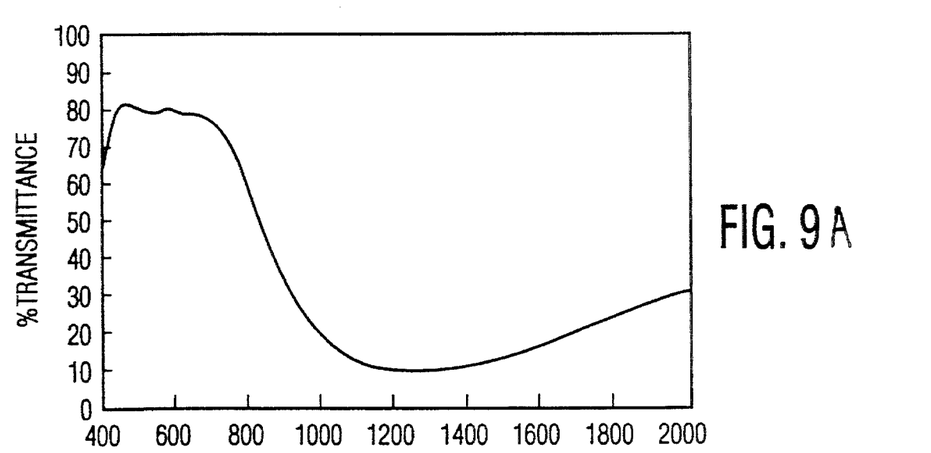
Figure 10:
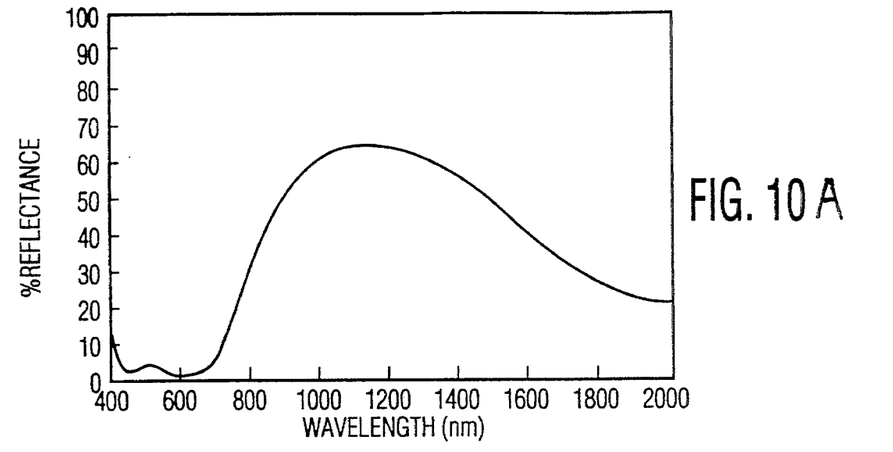

In FIG. 9A the characteristic of transmittance of the overall system is shown for sunlight in the spectral range between 340 nm and 2000 nm. In FIG. 10A the corresponding characteristic of reflectance is shown for light impingement from outside.

Figure 11:
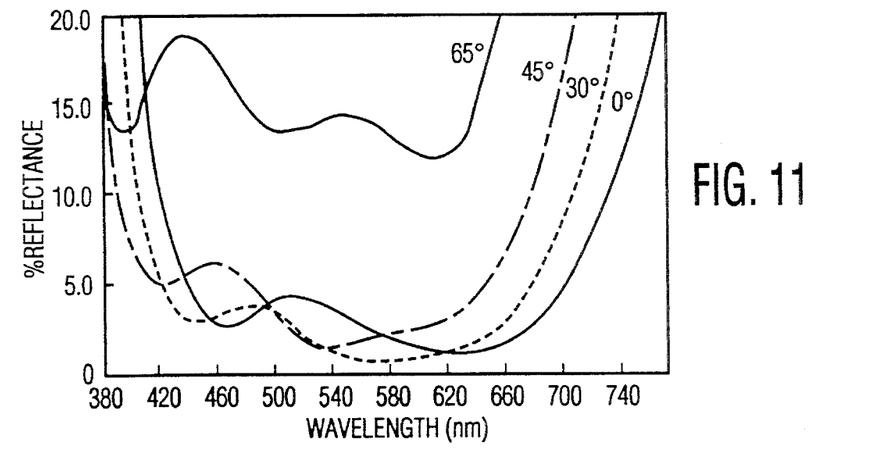

The reflectance characteristic according to FIG. 8A refers to light impinging from the inside, the reflectance characteristic of FIG. 10A for light impingement from the outside. The reflectance characteristics of FIG. 11A refer to light impinging from outside and show such different characteristics for different impinging angles of the light.

Figure 12:
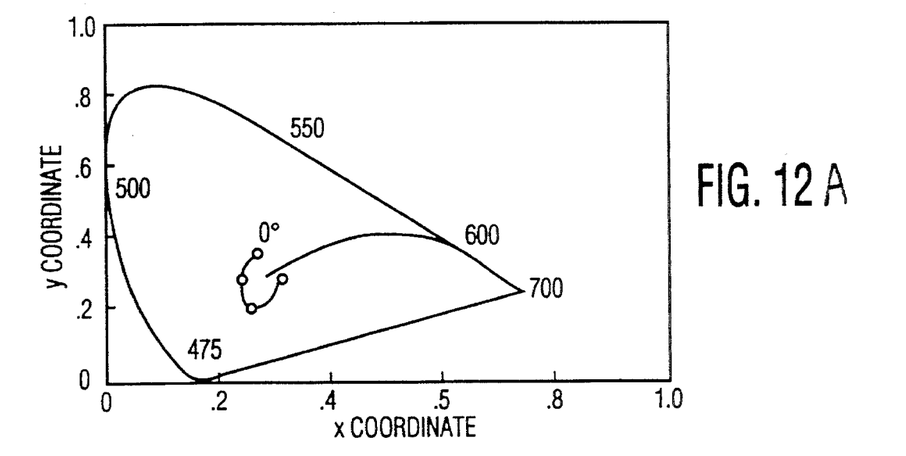

FIG. 12A shows the x and y colour co-ordinate values which, as a function of the impinging angle, characterize the colour change-over in reflectance. Thereby the x and y denote standardized colour value components according to the standard colour table of DIN 5033.

Figure 7A:
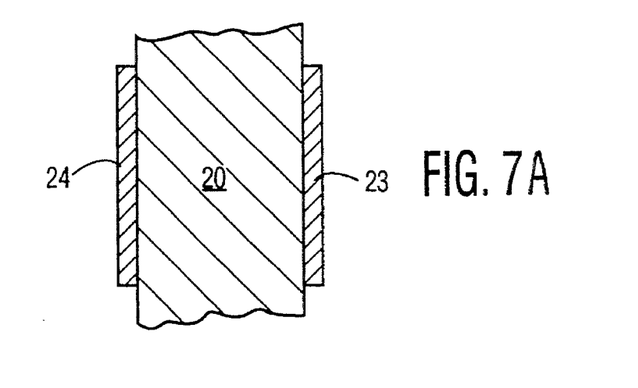
FIG. 7A to be considered together with the FIGS. 8A, 9A, 10A, 11 and 12A: an inventive coated transparent substrate according to an example no. 1 with the respective measuring results.
Figure 7B:
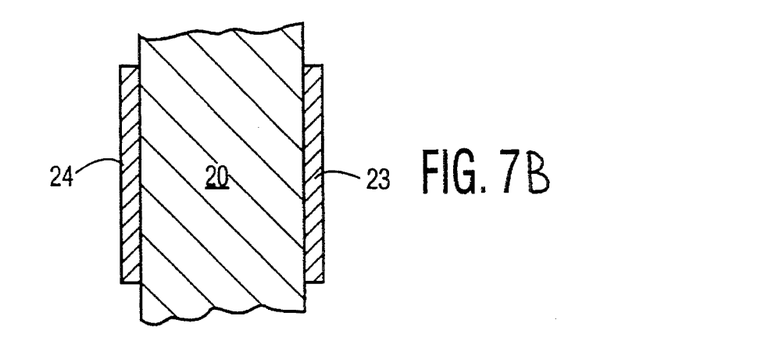
FIG. 7B to be considered together with the FIGS. 8B, 9B, 10B, 10C and 12B: a further embodiment of an inventive coated transparent substrate according to example no. 2 with the respective measuring results.

Subsequently the results are summarized:

Table 1.3 shows the $R_{vis}$-values of the inventive system with clear glass, further of uncoated green glass and of uncoated clear glass, in dependency from the angle of light impingement at a system according to FIG. 7B.

TABLE 1.3

|  | $R_{vis}$ | | |
|---|---|---|---|
|  | system | green glass | clear glass |
| 0° | 3,9% | 7,2% | 8,2% |
| 30° | 2,2% | 7,4% | 8,4% |
| 45° | 2,4% | 8,6% | 9,8% |
| 65° | 13,0% | 17,9% | 20,3% |

In table 1.4 the values of $T_{SUN}$, $R_{SUN}$ and of $T_{vis}$ are shown, again for the inventive system according to FIG. 7A and additionally for uncoated green glass and uncoated clear glass.

TABLE 1.4

|  | system | green glass | clear glass |
|---|---|---|---|
| $T_{SUN}$ | 51% | 57% | 92% |
| $R_{SUN}$ | 28% | 6% | 8% |
| $T_{vis}$ | 76% | 80% | 92% |

EXAMPLE 2:

According to FIG. 7B there is applied on a substrate of green glass and at its inside with respect to window application of the substrate between a room and outside, an inside system 23 according to FIG. 5 and an outside dielectric system according to a second layer-system 24. The layer-system 23 is construed as shown in table 2.1. Thereby 'I' in analogy to 'H' or 'L' stands for Indium-Tin-Oxide.

TABLE 2.1

|  | ITO 13 | SiO$_2$ 40 | ITO 137 | SiO$_2$ 199 | HfON 97 | SiO$_2$ 98 | [nm] |
|---|---|---|---|---|---|---|---|
| optical thickness | .05I | .12L | .55I | .59L | .5H | .29L | | design wave-length $\lambda_d = 500$ nm

The second system 24 is construed as was shown in table 1.2.

Figure 8B:
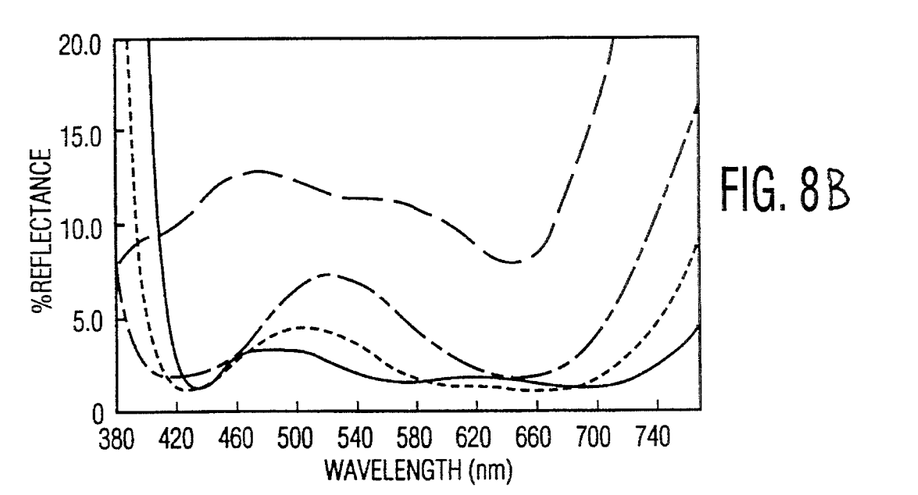
Figure 8C:
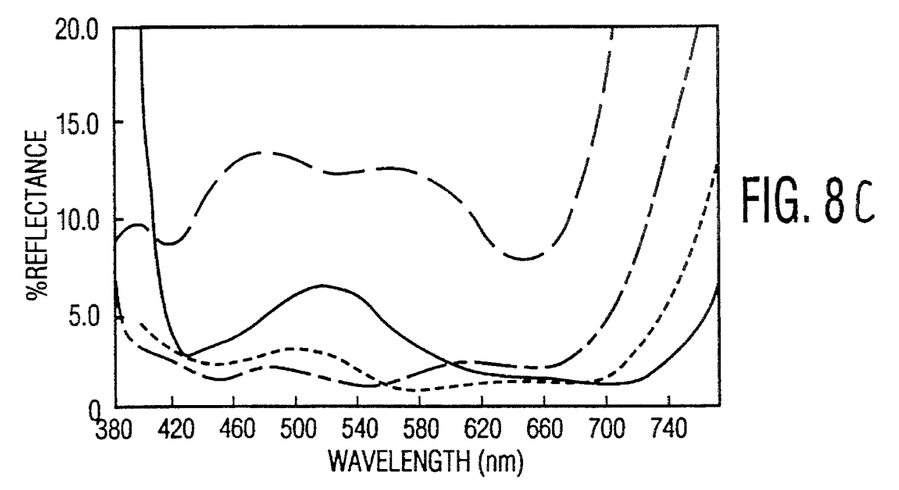
Figure 9B:
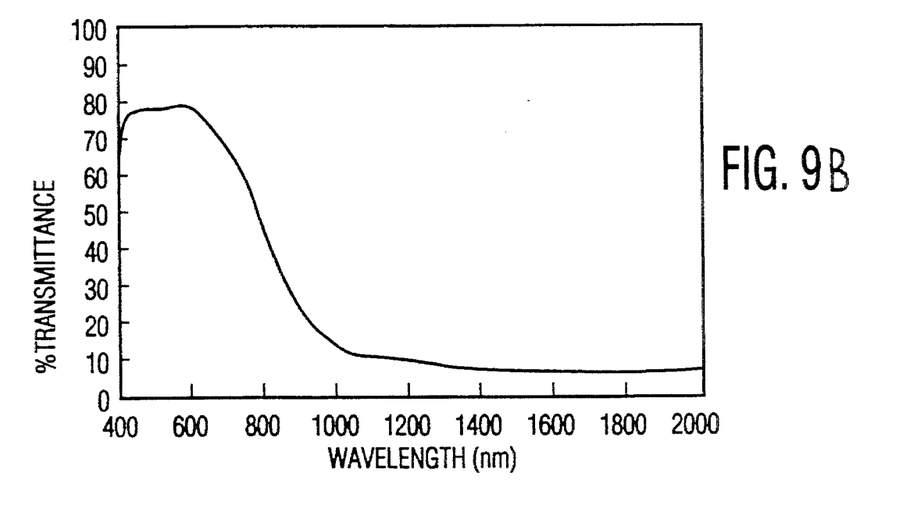
Figure 9C:
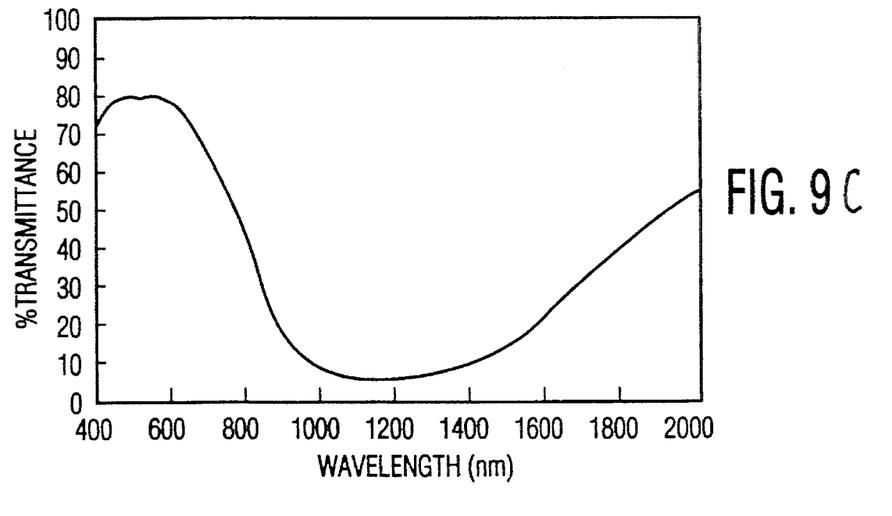
Figure 10B:
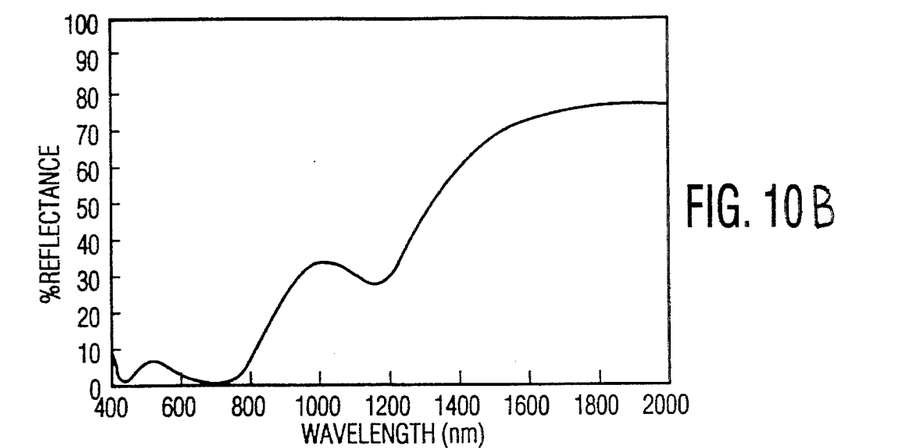
Figure 10C:
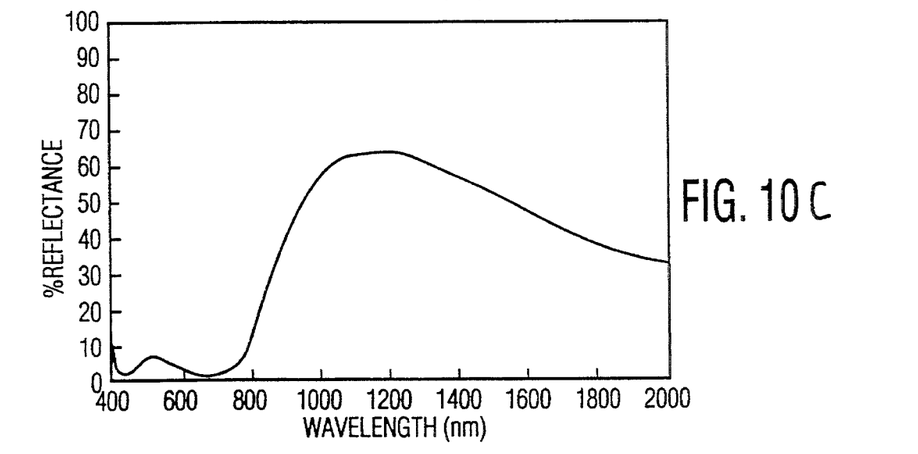
Figure 10D:
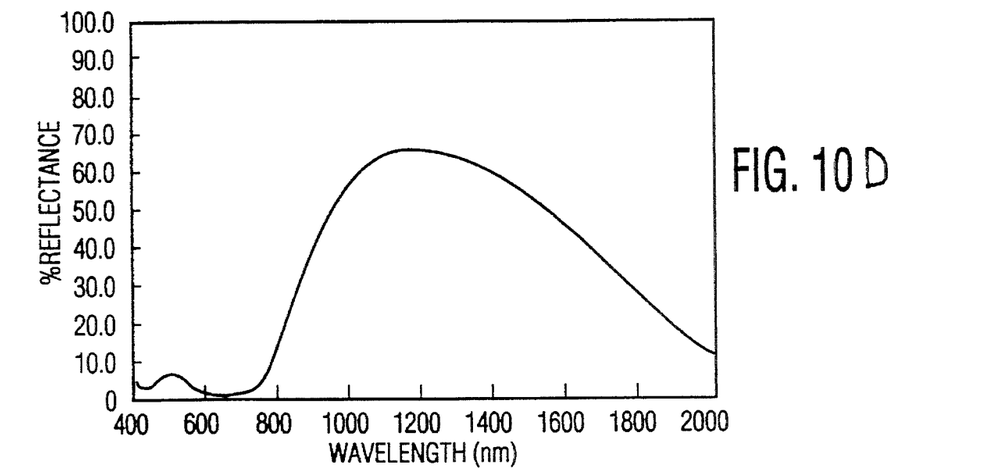
Figure 12B:
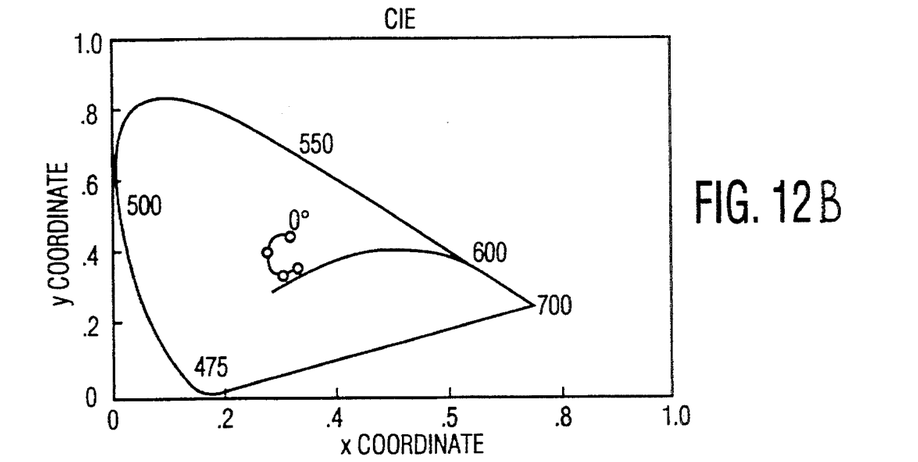
Figure 12C:
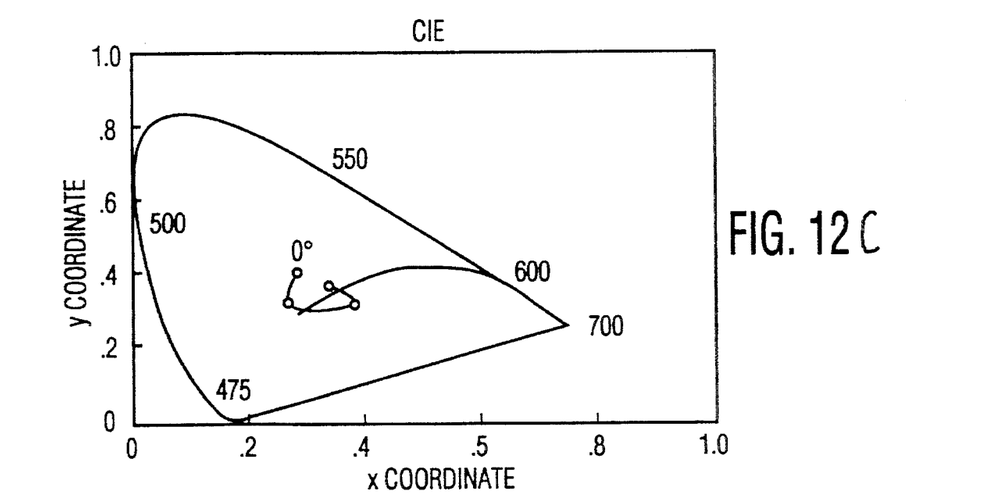

The characteristics, which were already discussed in connection with example 1, are, accordingly, shown in the FIG. 8B and further in FIG. 9B; the characteristics according to FIG. 10B are relative to the inside of the system according to FIG. 7B; FIG. 10C refers to the outside characteristic of the system according to FIG. 7B and the characteristics of FIG. 12B correspond to that of FIG. 12A of example 1.

The following tables 2.3 and 2.4 clearly show the resultant characteristic values.

TABLE 2.3

| | $R_{vis}$ | | |
|---|---|---|---|
| | system | green glass | clear glass |
| 0° | 5,2% | 7,2% | 8,2% |
| 30° | 2,7% | 7,4% | 8,4% |
| 45° | 2,0% | 8,6% | 9,8% |
| 65° | 10,9% | 17,9% | 20,3% |

TABLE 2.4

|  | system | green glass | clear glass |
|---|---|---|---|
| $T_{SUN}$ | 43% | 57% | 92% |
| $R_{SUN}$ | 22% | 6% | 8% |
| $T_{vis}$ | 78% | 80% | 92% |

Figure 7C:
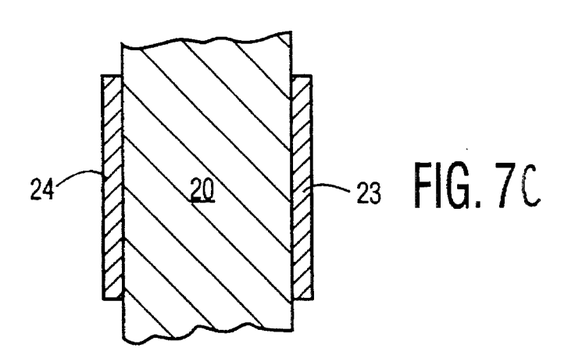
FIG. 7C to be considered together with the FIGS. 8C, 9C, 10C and 12C: a third example of an inventive coated transparent substrate with the respective measuring results according to example no. 3.

EXAMPLE 3:

According to FIG. 7C a substrate 20 of green glass was coated on both of its sides with a layer-system according to FIG. 6. These systems 24 were construed according to thee indications in table 1.2. In the FIGS. 8C, 9C, 10D and 12C the respective characteristics defined, as was explained in connection with example 1, are shown. Further there results:

TABLE 3.3

| | $R_{vis}$ | | |
|---|---|---|---|
| | system | green glass | clear glass |
| 0° | 4,1% | 7,2% | 8,2% |
| 30° | 1,5% | 7,4% | 8,4% |
| 45° | 1,5% | 8,6% | 9,8% |
| 65° | 11,8% | 17,9% | 20,3% |

TABLE 3.4

|  | system | green glass | clear glass |
|---|---|---|---|
| $T_{SUN}$ | 45% | 57% | 92% |
| $R_{SUN}$ | 22% | 6% | 8% |
| $T_{vis}$ | 79% | 80% | 92% |

In the following two further examples of the inventively coated transparent substrate are given, which has been optimized for 0° impinging angle of light, so as for instance for side windows of cars or for other heat protective glasses with anti-reflex characteristic, realized at rather low price, as for instance for art objects.

Figure 7D:
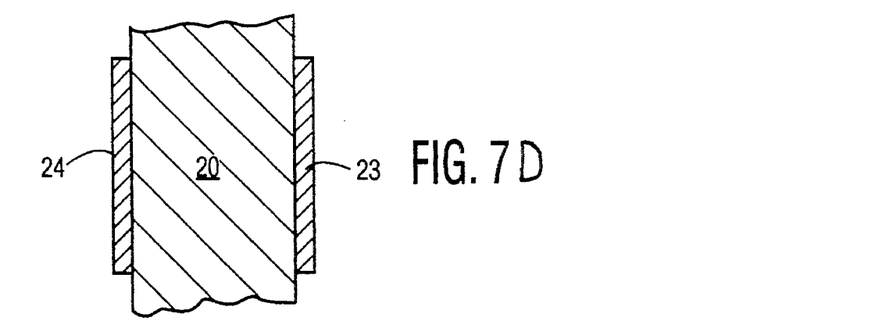
FIGS. 7D two further embodiments of an inventive and 7D coated transparent substrate according to the examples no. 4 and no. 5.

EXAMPLE 4:

According to FIG. 7D on both sides of a green glass substrate 20 a dielectric layer-system according to FIG. 6 was applied. Both layer-systems were construed according to table 4.1.

TABLE 4.1

|  | HfON 10 | SiO$_2$ 37 | HfON 103 | SiO$_2$ 172 | HfON 99 | SiO$_2$ 86 | [nm] |
|---|---|---|---|---|---|---|---|
| optical thickness | 0.5H | .11L | .53H | .51L | .51H | .254L | |

$\lambda_d = 500$ nm

At the system according to FIG. 7D, optimized for 0° impinging angle, the values shown in table 4.2 were measured.

TABLE 4.2

|  |  | system | green glass | clear glass |
|---|---|---|---|---|
| $R_{vis'}$ | 0° | <0,7% | 7,2% | 8,21% |
| $T_{vis'}$ | 0° | 82% | 80% | 92% |
| $T_{SUN'}$ | 0° | 45% | 57% | 92% |
| $R_{SUN'}$ | 0° | 22% | 6% | 8% |

Figure 7E:
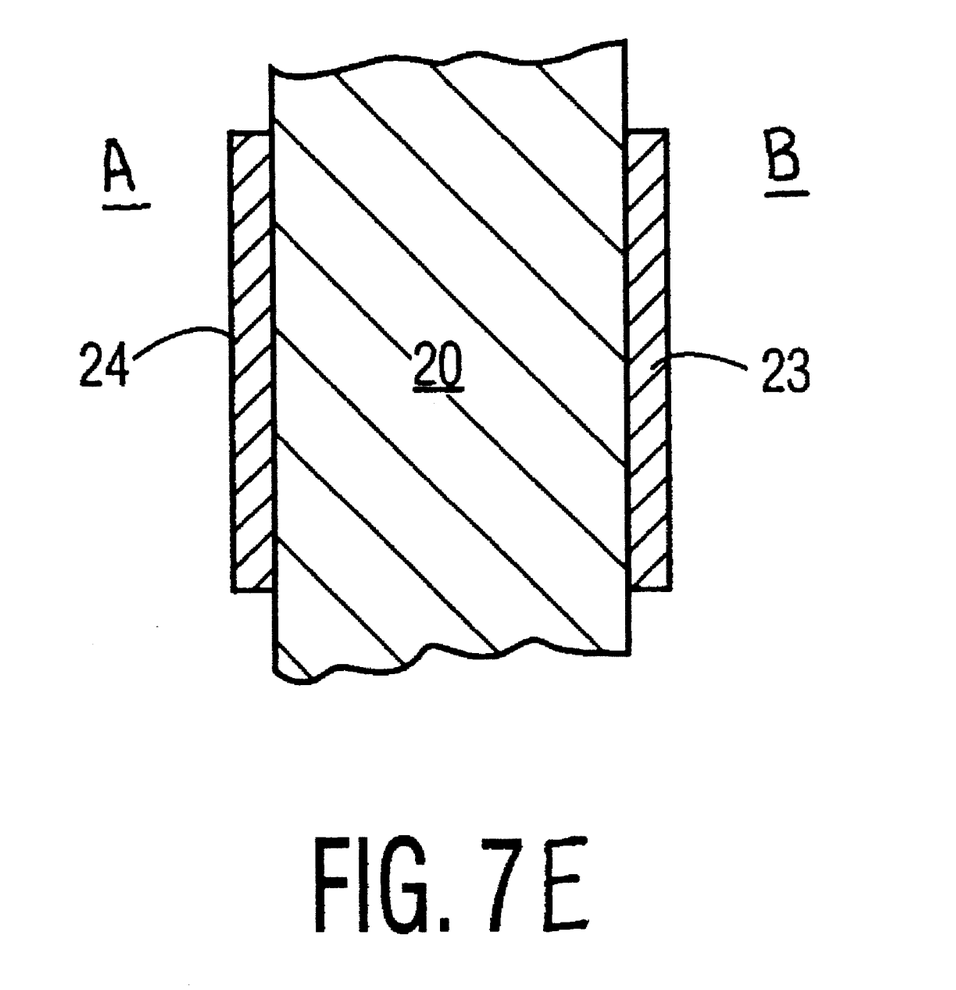

EXAMPLE 5:

According to FIG. 7E a substrate 20 made of clear glass was coated with layer-system 24 and 23, i.e. with a dielectric system 24 and a dielectric/metallic system 23. The dielectric system 24 was construed according to that one of example 4. The metallic dielectric system 23 was construed as shown in table 5.1.

TABLE 5.1

| thickness | HfON 25 | HfN 17 | HfON 43 | SiO$_2$ 190 | HfON 105 | SiO$_2$ 22 | [nm] |
|---|---|---|---|---|---|---|---|
| optical | .13H | — | .22H | .56L | .54H | .26L | |

TABLE 5.1-continued

| thickness | HfON 25 | HfN 17 | HfON 43 | SiO$_2$ 190 | HfON 105 | SiO$_2$ 22 [nm] |
|---|---|---|---|---|---|---|
| thickness | | | | | | |

There were measured the values stated in table 5.2.

TABLE 5.2

| | system | green glass | clear glass |
|---|---|---|---|
| R$_{vis'}$, 0° considered from A | 4,5% | 7,2% | 8,2% |
| R$_{vis'}$ 0° considered from B | <=1% | 7,2% | 8,2% |
| T$_{vis'}$ 0° | 75% | 80% | 92% |
| T$_{SUN'}$ 0° | 50,5% | 57% | 92% |
| R$_{SUN'}$ 0° considered from A | 28% | 6% | 8% |
| R$_{SUN'}$ 0°, considered from B | 22% | 75,5% | 92% |

As becomes clear, it is absolutely possible to construe also an ITO-system optimized for 0° impinging angle.

Thus, according to the present invention and with the inventive Oxynitride, heat protective systems with highly accurate anti-reflex characteristics may be construed, optimized for 0° light impinging angle too. It is further evident that the systems described above may be inverted with respect to "inside" and "outside" depending from the application for which the respective inventively coated substrates are intended for.

The dielectric system may further be a four-, six-, eight- etc.-layer-system according to the general rule:

Substrate [0.1H 0.1L (0.5H 0.5L)$^x$, 0.5H 0.25L], wherein x denotes here a repetition factor with x= 0,1, 2 ... of the sequent denoted within ( ).

The metallic/dielectric layer-system, too, may be extended on a six, eight ... layer-system according to the rule:

Substrate [0.1H N 0.1H 0.5L (0.5H 0.5L)$^x$ 0.5H 0.25L] with the factor of repetition x= 0,1, 2 ....

As a four-layer-system the ITO-system may be constructed as follows:

0.1I 0.1L 0.5I 0.25L, as a five-layer-system:

0.1I 0.1L 0.5I 0.5H 0.25L or more general:

0.1I 0.1L 0.5I 0.5L (0.5H 0.5L)$^x$ 0.5H 0.25L with the factor of repetition x= 1, 2 ....

The examples stated above are an optimal solution with respect to heat protection, anti-reflex effect and simple layout and thus minimal costs.

It is evident that with more layers the heat protective effect may be improved, whereby the anti-reflex effect may eventually be disadvantageously affected. Thereby higher costs will arise for the higher number of layers.

We claim:

1. A coated transparent substrate, comprising on at least one of its sides, a multi-layer transparent layer-system with at least one layer of the Oxynitride of Hafnium, so as to form a transparent optical element, said layer-system comprising a sequence of a Hafnium-Oxynitride layer and of a Silicon-Oxide layer comprising following layers of respective thickness, considered in a direction from said substrate:

| | |
|---|---|
| HfON: | 8 nm. |
| SiO$_2$: | 42 nm, |
| HfON: | 103 nm, |
| SiO$_2$: | 193 nm. |
| HfON: | 98 nm, |
| SiO$_2$: | 95 nm. |

2. A coated transparent substrate, comprising on at least one of its sides, a multi-layer transparent layer-system with at least one layer of the Oxynitride of Hafnium, so as to form a transparent optical element, said layer-system being construed, considered in a direction from said substrate, as follows with the respective layer thicknesses:

| | |
|---|---|
| HfON: | 38 nm. |
| HfN: | 14 nm, |
| HfON: | 43 nm, |
| SiO$_2$: | 182 nm. |
| HfON: | 95 nm, |
| SiO$_2$: | 81 nm. |

3. A coated transparent substrate, comprising on at least one of its sides, a multi-layer transparent layer-system with at least one layer of the Oxynitride of Hafnium, so as to form a transparent optical element, said layer-system being construed, in a direction from said substrate, as follows, with the respective layer thicknesses:

| | |
|---|---|
| Indium-Tin-Oxide: | 13 nm, |
| SiO$_2$: | 40 nm, |
| Indium-Tin-Oxide: | 137 nm, |
| SiO$_2$: | 199 nm, |
| HfON: | 97 nm, |
| SiO$_2$ | 98 nm. |

* * * * *